(12) United States Patent
Ma

(10) Patent No.: US 10,520,984 B2
(45) Date of Patent: Dec. 31, 2019

(54) ELECTRONIC DEVICE AND MANUFACTURING METHOD THEREOF

(71) Applicant: GUANGDONG OPPO MOBILE TELECOMMUNICATIONS CORP., LTD., Dongguan, Guangdong (CN)

(72) Inventor: Jingyi Ma, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 16/194,067

(22) Filed: Nov. 16, 2018

(65) Prior Publication Data

US 2019/0278332 A1   Sep. 12, 2019

(30) Foreign Application Priority Data

Mar. 9, 2018   (CN) .......................... 2018 1 0193183

(51) Int. Cl.
*G06F 1/16*     (2006.01)
*G02F 1/1333*   (2006.01)
(Continued)

(52) U.S. Cl.
CPC ...... *G06F 1/1643* (2013.01); *G02F 1/133305* (2013.01); *G06F 1/1637* (2013.01);
(Continued)

(58) Field of Classification Search
CPC .......................... G02F 1/133305; G06F 1/1652
See application file for complete search history.

(56) References Cited

U.S. PATENT DOCUMENTS 4,695,827 A  * 9/1987 Beining ................ G06F 3/042
                                                   341/31
5,598,527 A  * 1/1997 Debrus ................ G06F 3/044
                                                   341/22
(Continued)

FOREIGN PATENT DOCUMENTS

CN    206039370       3/2017
CN    107124484       9/2017
(Continued)

OTHER PUBLICATIONS

EPO, Office Action for EP Application No. 18214354, dated Jun. 6, 2019.
(Continued)

*Primary Examiner* — Adrian S Wilson
(74) *Attorney, Agent, or Firm* — Hodgson Russ LLP

(57) ABSTRACT

The present disclosure provides an electronic device and a manufacturing method for the electronic device. The electronic device includes a light permeable display screen, a light permeable cover plate and one or a plurality of light sensors. The light permeable display screen includes a first surface and a second surface opposite to the first surface. The light permeable cover plate faces the first surface, covers the light permeable display screen, and includes a flat plate portion and one or a plurality of curved surface portions. The one or the plurality of curved surface portions extends away from the flat plate portion, protrudes from the light permeable display screen horizontally, and bends towards the light permeable display screen vertically, so as to form one or a plurality of accommodating spaces together with the light permeable display screen. The light sensor is arranged in the accommodating space.

19 Claims, 6 Drawing Sheets

(51) Int. Cl.
*H01L 51/56* (2006.01)
*H05K 5/00* (2006.01)
*H04M 1/02* (2006.01)

(52) U.S. Cl.
CPC .......... *G06F 1/1652* (2013.01); *G06F 1/1656* (2013.01); *G06F 1/1658* (2013.01); *H01L 51/56* (2013.01); *H04M 1/026* (2013.01); *H04M 1/0266* (2013.01); *H05K 5/0017* (2013.01); *G06F 2200/1612* (2013.01); *H04M 2250/12* (2013.01)

(56) References Cited

U.S. PATENT DOCUMENTS

| | | | | | |
|---|---|---|---|---|---|
| 5,729,219 | A * | 3/1998 | Armstrong | .......... | G06F 3/03547 340/7.55 |
| 7,113,196 | B2 * | 9/2006 | Kerr | .......... | G06F 1/16 315/292 |
| 7,452,098 | B2 * | 11/2008 | Kerr | .......... | G06F 1/1601 362/154 |
| 8,654,524 | B2 * | 2/2014 | Pance | .......... | G06F 1/1616 361/679.55 |
| 9,600,037 | B2 * | 3/2017 | Pance | .......... | G06F 1/1616 |
| 10,248,221 | B2 * | 4/2019 | Pance | .......... | G06F 1/1616 |
| 2001/0043189 | A1 * | 11/2001 | Brisebois | .......... | G06F 3/03547 345/156 |
| 2002/0158838 | A1 * | 10/2002 | Smith | .......... | G06F 1/1616 345/156 |
| 2005/0212777 | A1 * | 9/2005 | Ing | .......... | G06F 3/0433 345/173 |
| 2008/0084404 | A1 * | 4/2008 | Andre | .......... | G09F 9/30 345/204 |
| 2009/0008234 | A1 * | 1/2009 | Tolbert | .......... | H01H 13/702 200/600 |
| 2009/0173534 | A1 * | 7/2009 | Keiper | .......... | H01R 12/592 174/350 |
| 2010/0026656 | A1 * | 2/2010 | Hotelling | .......... | G06F 3/044 345/174 |
| 2011/0037624 | A1 * | 2/2011 | Pance | .......... | G06F 3/044 341/33 |
| 2011/0037734 | A1 * | 2/2011 | Pance | .......... | G06F 3/016 345/177 |
| 2011/0038114 | A1 * | 2/2011 | Pance | .......... | G06F 1/1616 361/679.4 |
| 2012/0013583 | A1 | 1/2012 | Powell et al. | | |
| 2012/0329525 | A1 * | 12/2012 | Hashimoto | .......... | C03C 15/00 455/566 |
| 2013/0076649 | A1 * | 3/2013 | Myers | .......... | H04M 1/0268 345/173 |
| 2013/0300697 | A1 * | 11/2013 | Kim | .......... | G06F 1/1626 345/173 |
| 2014/0111910 | A1 * | 4/2014 | Lin | .......... | G06F 1/1637 361/679.01 |
| 2014/0307378 | A1 * | 10/2014 | Kang | .......... | G06F 1/1652 361/679.21 |
| 2014/0307396 | A1 * | 10/2014 | Lee | .......... | H05K 1/028 361/749 |
| 2016/0295176 | A1 * | 10/2016 | Jeong | .......... | G09G 3/00 |
| 2017/0010750 | A1 | 1/2017 | Hotelling et al. | | |
| 2017/0202096 | A1 | 7/2017 | Park et al. | | |

FOREIGN PATENT DOCUMENTS

| | | |
|---|---|---|
| CN | 107704024 | 2/2018 |
| CN | 207037545 | 2/2018 |
| CN | 108494908 | 9/2018 |
| CN | 108696606 | 10/2018 |

OTHER PUBLICATIONS

SIPO, First Office Action for CN Application No. 201810193183, dated Apr. 16, 2019.
WIPO, English translation of the ISR and WO for PCT/CN2019/071631, dated Apr. 8, 2019.

* cited by examiner

ELECTRONIC DEVICE AND MANUFACTURING METHOD THEREOF

CROSS-REFERENCE TO RELATED APPLICATION

This application claims priority to Chinese Patent Application Serial No. 201810193183.1, filed with the State Intellectual Property Office of P. R. China on Mar. 9, 2018, the entire disclosure of which is incorporated herein by reference.

FIELD

The present disclosure relates to a field of electronic technology, and more particularly to an electronic device and a manufacturing method thereof.

BACKGROUND

As mobile phone products move toward an era of full screens, a screen-to-body ratio of mobile phones is increasing, which brings higher requirements for hardware and structure technology. Generally, existing mobile phones set a light sensor in the top of the screen, but as a space outside the screen gets less, and the light sensor cannot be placed in the original position. Therefore, how to set the light sensor in the full screen without interference between the light sensor and the full screen has become an urgent problem to be solved.

SUMMARY

Embodiments of the present disclosure provided an electronic device and a manufacturing method thereof.

The electronic device according to embodiments of the present disclosure includes:
  a light permeable display screen including a flat display portion and a curved display portion extending away from the flat display portion;
  a light permeable cover plate covering the light permeable display screen, a transverse size of the light permeable cover plate being greater than a transverse size of the light permeable display screen, the light permeable cover plate including a flat plate portion and one or a plurality of curved surface portions, the one or the plurality of curved surface portions extending away from the flat plate portion, protruding from the light permeable display screen horizontally, and bending towards the light permeable display screen vertically, so as to form one or a plurality of accommodating spaces together with the light permeable display screen, the curved display portion bending in a direction consistent with a bending direction of the one or the plurality of curved surface portions; and
  one or a plurality of light sensors arranged in the one or the plurality of accommodating spaces.

The electronic device according to another embodiment of the present disclosure includes:
  a light permeable display screen, the light permeable display screen including a first surface and a second surface opposite to the first surface;
  a light permeable cover plate facing the first surface of the light permeable display screen and covering the light permeable display screen, the light permeable cover plate including a flat plate portion and one or a plurality of curved surface portions, the one or the plurality of curved surface portions extending away from the flat plate portion, protruding from the light permeable display screen horizontally, and bending towards the light permeable display screen vertically, so as to form one or a plurality of accommodating spaces together with the light permeable display screen; and
  one or a plurality of light sensors arranged in the one or the plurality of accommodating spaces, the one or the plurality of light sensors being configured to receive visible light through the one or the plurality of curved surface portions.

The manufacturing method according to embodiments of the present disclosure includes the following operations:
  providing a light permeable display screen, the light permeable display screen including a first surface and a second surface opposite to the first surface;
  covering a first surface of the light permeable display screen with a light permeable cover plate, the light permeable cover plate including a flat plate portion and a curved surface portion, the curved surface portion extending away from the flat plate portion, protruding from the light permeable display screen horizontally, and bending towards the light permeable display screen vertically, so as to form an accommodating space together with the light permeable display screen; and
  providing a light sensor, arranging the light sensor in the accommodating space, the light sensor being configured to receive visible light through the curved surface portion.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
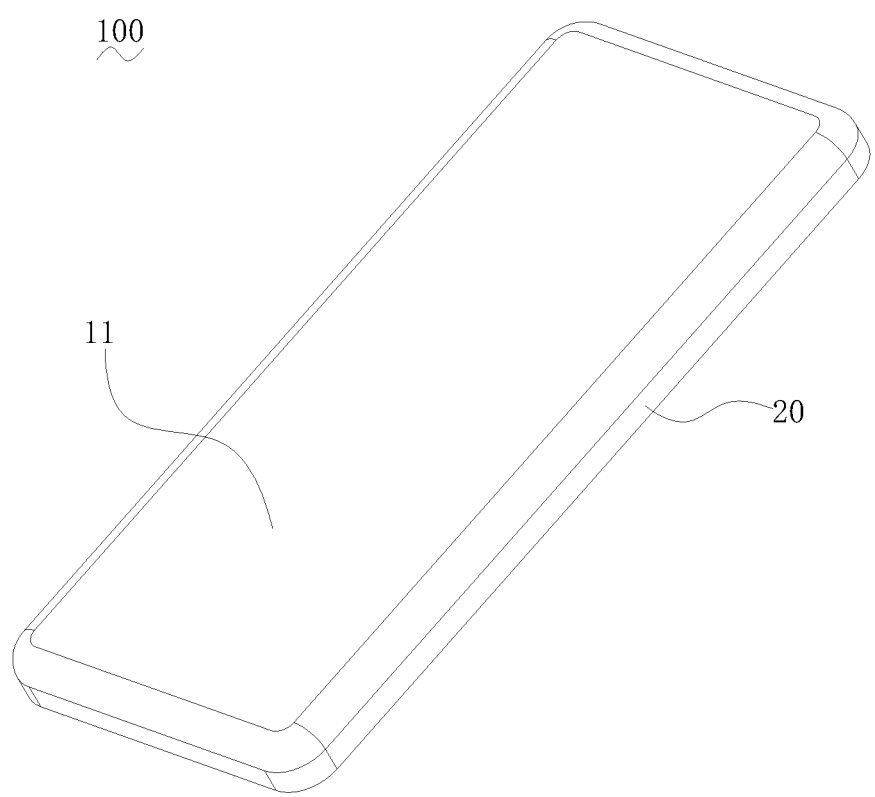
FIG. 1 is a perspective schematic view of an electronic device according to embodiments of the present disclosure.

Embodiments of the present disclosure will be described in detail and examples of the embodiments will be illustrated in the accompanying drawing. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumferential" should be construed to refer to the orientation or position as then described or as illustrated in the drawings under discussion. These relative terms are for convenience of description, and do not indicate or imply that the device or element referred to must have a particular orientation or be constructed and operated in a particular orientation, and hence cannot be constructed to limit the present disclosure.

In the description of the present disclosure, it should be understood that, unless specified or limited otherwise, the terms "mounted," "connected," and "coupled" and variations thereof are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Electronic apparatuses such as a mobile phone or a tablet computer usually detect light intensity in environment by installing a light sensor. A mobile phone is taken as an example, in which the light sensor is usually provided at an upper area of the mobile phone. When a user stays in different light conditions, the light sensor feeds received ambient light information back to a processor, and the processor performs corresponding instructions so as to adjust brightness of a display screen assembly automatically. In related art, to provide the light sensor to the electronic apparatus, it is required to provide corresponding holes in a housing to receive visible light signals. Along with development of the electronic apparatus, people have increasingly higher demands for appearance and operation experience of the mobile phone. Mobile phone develops towards a full screen. However, an ultra-narrow bezel forms between the housing and the display screen assembly of the full screen mobile phone, as a width of the ultra-narrow bezel is too small, an enough space for providing the hole may not exist, and even the hole can be provided, it results a reduction of overall strength of the bezel, and further lower reliability of the electronic apparatus.

Embodiments of the present disclosure provided an electronic device and a manufacturing method thereof.

The electronic device according to embodiments of the present disclosure includes:
  a light permeable display screen including a flat display portion and a curved display portion extending away from the flat display portion;
  a light permeable cover plate covering the light permeable display screen, a transverse size of the light permeable cover plate being greater than a transverse size of the light permeable display screen, the light permeable cover plate including a flat plate portion and one or a plurality of curved surface portions, the one or the plurality of curved surface portions extending away from the flat plate portion, protruding from the light permeable display screen horizontally, and bending towards the light permeable display screen vertically, so as to form one or a plurality of accommodating spaces together with the light permeable display screen, the curved display portion bending in a direction consistent with a bending direction of the one or the plurality of curved surface portions; and
  one or a plurality of light sensors arranged in the one or the plurality of accommodating spaces.

The electronic device according to another embodiment of the present disclosure includes:
  a light permeable display screen, the light permeable display screen including a first surface and a second surface opposite to the first surface;
  a light permeable cover plate facing the first surface of the light permeable display screen and covering the light permeable display screen, the light permeable cover plate including a flat plate portion and one or a plurality of curved surface portions, the one or the plurality of curved surface portions extending away from the flat plate portion, protruding from the light permeable display screen horizontally, and bending towards the light permeable display screen vertically, so as to form one or a plurality of accommodating spaces together with the light permeable display screen; and
  one or a plurality of light sensors arranged in the one or the plurality of accommodating spaces, the one or the plurality of light sensors being configured to receive visible light through the one or the plurality of curved surface portions.

The manufacturing method according to embodiments of the present disclosure includes the following operations:
  providing a light permeable display screen, the light permeable display screen including a first surface and a second surface opposite to the first surface;
  covering a first surface of the light permeable display screen with a light permeable cover plate, the light permeable cover plate including a flat plate portion and a curved surface portion, the curved surface portion extending away from the flat plate portion, protruding from the light permeable display screen horizontally, and bending towards the light permeable display screen vertically, so as to form an accommodating space together with the light permeable display screen; and
  providing a light sensor, arranging the light sensor in the accommodating space, the light sensor being configured to receive visible light through the curved surface portion.

Refer to FIG. 1 to FIG. 4, an electronic device 100 according to embodiments of the present disclosure includes a light permeable display screen 13, a light permeable cover plate 11, a light sensor 15 and a housing 20. The electronic device 100 can be a mobile phone or a tablet computer and the like. The electronic device 100 according to embodiments of the present disclosure is illustrated by taking the mobile phone as an example. Certainly, a specific form of the electronic device 100 can also be others, which will not be limited here. The light permeable display screen 13 includes an upper surface 131 (which serves as an example of a first surface) and a lower surface 132 (which serves as an example of a second surface). The lower surface 132 is opposite to the upper surface 131. The light permeable display screen 13 is used for luminescence display through the upper surface 131. The light permeable cover plate 11 includes a flat plate portion 111 and a curved surface portion 112. The curved surface portion 112 is formed to extend away from the flat plate portion 111 and bend. The curved surface portion 112 protrudes from the light permeable display screen 13 and forms an accommodating space 14 together with the light permeable display screen 13. The light sensor 15 is disposed in the accommodating space 14, and the light sensor 15 receives the visible light through the curved surface portion 112.

In the electronic device 100, the housing 20 mainly plays a role of accommodation and protection so as to prevent external factors from causing damage to these elements. In addition, the housing 20 substantially forms to be a rectangular frame so that the electronic device 100 formed by assembling the housing 20 and the electronic device 10 has a rectangular shape. In order to make the electronic device 100 more artistic, it is possible to process rounded corners at corners of the housing 20 so that the electronic device 100 has a rounded rectangular shape. In addition, the housing 20 may be formed by machining an aluminum alloy by a CNC machine tool, or may be injection molded from polycarbonate (PC) material or PC in combination with ABS material.

In summary, in the electronic device 100 and the manufacturing method of the embodiment of the present disclosure, the light permeable cover plate 11 is covered on the light permeable display screen 13, and a transverse dimension of the light permeable cover plate 11 is greater than that of the light permeable display screen 13. The protruding portion of the curved surface portion 112 of the light permeable cover plate 11 and the light permeable display screen 13 form the accommodating space 14, and the light sensor 15 can be placed in the accommodating space 14 in the case of a full screen. The light sensor 15 receives visible light through the curved surface portion 112. In this way, it is guaranteed that the light sensor 15 can perform its functions stably.

Figure 2:
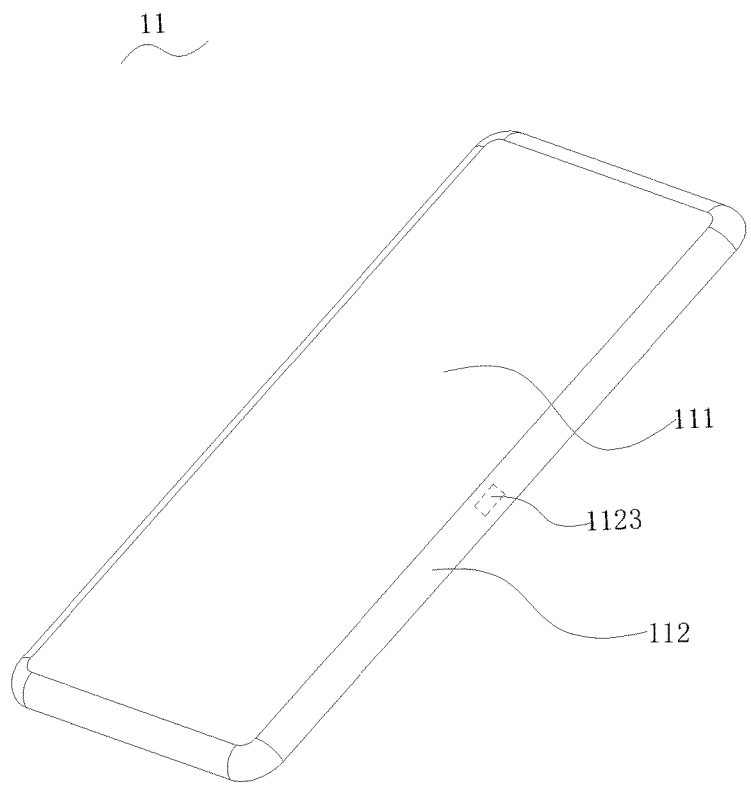
FIG. 2 is a perspective schematic view of a light permeable cover plate according to embodiments of the present disclosure.
Figure 3:
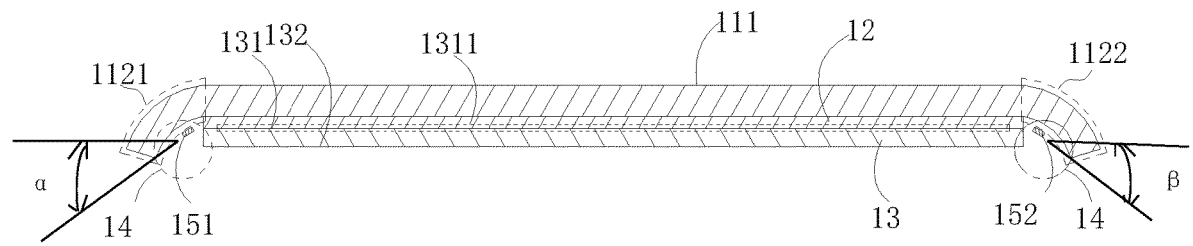
FIG. 3 is a section view of an electronic device according to some embodiments of the present disclosure.

Referring to FIGS. 2 and 3, in some embodiments, the curved surface portion 112 further includes a window area 1123, and the light sensor 15 and the window area 1123 face each other. In this way, the light sensor 15 can receive visible light through the window area 1123, feed the visible light information back to the processor, and the processor executes corresponding instructions to automatically adjust the brightness of the light permeable display screen 13 so that the user can obtain better experience in different light environments and the power is also saved.

Referring to FIGS. 2 and 3 again, in some embodiments, the curved surface portion 112 includes a first curved surface portion 1121 and a second curved surface portion 1122, the first curved surface portion 1121 and the second curved surface portion 1122 are symmetrically disposed. Each of the curved surface portions 112 forms the accommodating space 14 together with the light permeable display screen 13. The light sensor 15 includes a first light sensor 151 and a second light sensor 152, and the first light sensor 151 and the second light sensor 152 are respectively disposed in the accommodating space. In this way, by providing the light sensor 15 in each of the accommodating spaces 14 at left and right sides of the light permeable cover plate 11, an angle and data of the visible light received by the two light sensors 15 are mutually compensated, thereby ensuring the accuracy of the light adjustment, hence ensuring better user experience.

Specifically, during the installation process, the light sensor 15 faces the window area 1123 and the first light sensor 151 and the second light sensor 152 are respectively disposed in the accommodating spaces 14 formed by the first curved surface portion 1121 and the light permeable display screen 13, and by the second curved surface portion 1122 and the light permeable display screen 13. In some examples, the first light sensor 151 and the second light sensor 152 are disposed in the accommodating space 14 at a certain angle of inclination relative to a plane where the flat display portion is located respectively (for example, as illustrated in FIG. 3, the first light sensor is located in the first accommodating space at a first angle of inclination i.e. a relative to the plane where the flat plate portion is located, and the second light sensor is located in the second accommodating space at a second angle of inclination i.e. β relative to the plane where the flat plate portion is located) so as to keep light-sensitive surfaces to be parallel with the curved surface portion 112 as much as possible. In other examples, the first light sensor 151 and the second light sensor 152 are placed horizontally in the accommodating space 14. Since the light permeable cover plate 11 includes the curved surface portion 112 and the light sensor 15 receives the visible light through the curved surface portion 112, if only one light sensor 15 is used, when the electronic device is used by the user in the same environment, a tilt of the light permeable display screen 13 can result a change of a visible light receiving angle of the light sensor 15, causing the brightness of the light permeable display screen 13 to change significantly, thereby affecting the user experience. Therefore, the first light sensor 151 and the second light sensor 152 are respectively disposed in the accommodating spaces 14 at the left and right sides of the light permeable display screen 13, and the visible light receiving angles of the two light sensors are mutually compensated, so that the accuracy of the light adjustment can be ensured. Moreover, in some examples, when the light permeable display screen 13 is placed flat, the two light sensors 15 receive the visible light at the same angle, and the processor can take 50% of the data of each of the light sensors 15 as a value for adjusting the brightness. In other examples, when the light permeable display screen 13 is tilted to the side of the first light sensor 151, the visible light receiving angle of the first light sensor 151 becomes smaller, and the visible light receiving angle of the second light sensor 152 becomes larger, thus causing received data by the two light sensors to be inconsistent, in which case the processor can use an average value of the two data as the value for the brightness adjustment so as to accurately adjust the brightness of the light permeable display screen 13 to ensure better user experience. Moreover, in some examples, the first light sensor 151 and the second light sensor 152 can be disposed in the formed accommodating spaces 14 symmetrically. In other examples, the first light sensor 151 and the second light sensor 152 can also be disposed in the formed accommodating spaces asymmetrically.

Figure 4:
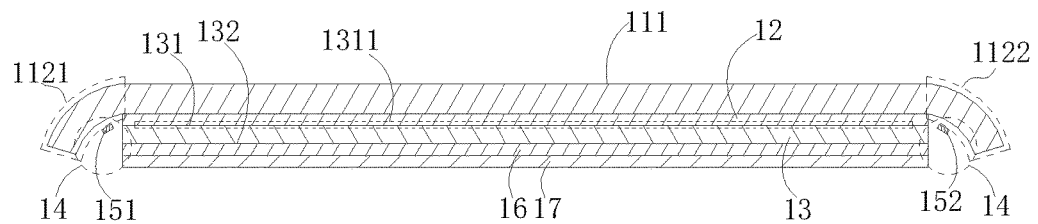
FIG. 4 is a section view of an electronic device according to some embodiments of the present disclosure.
Figure 5:
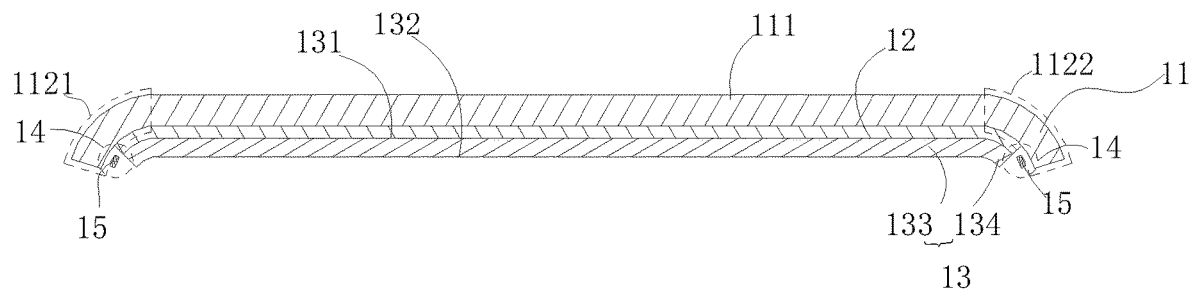
FIG. 5 is a section view of an electronic device according to some embodiments of the present disclosure.
Figure 6:
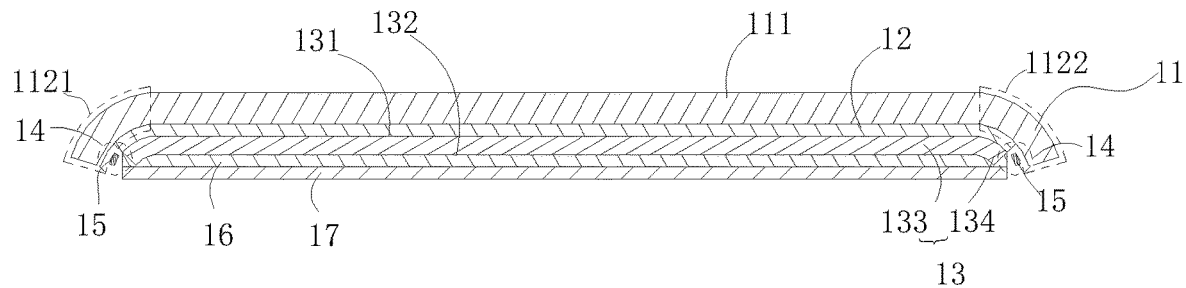
FIG. 6 is a section view of an electronic device according to some embodiments of the present disclosure.

Referring to FIGS. 3 and 4, in some embodiments, the light permeable display screen 13 includes a flat display portion 133. In this case, the light permeable display screen 13 is a flat display screen and performs display only through the flat plate portion 111 of the light permeable cover plate 11. Referring to FIGS. 5 and 6, in another example, the light permeable display screen 13 includes the flat display portion 133 and a curved display portion 134, and the curved display portion 134 is formed to extend away from the flat display portion 133. An upper surface of the flat display portion 133 (which serves as an example of a third surface) and an upper surface of the curved display portion 134 (which serve as an example of a fourth surface) constitute the upper surface 131 of the light permeable display screen 13, and a transverse size of the light permeable cover plate 11 is greater than a transverse size of the light permeable display screen 13. In this case, the light permeable display screen 13 is a curved display screen, and the first light sensor 151 and the second light sensor 152 disposed in the accommodating spaces 14 at both sides of the light permeable display screen 13 receive visible light and transmit data signals to the processor, the receiving angle and data of the two light sensors compensate each other, thereby accurately adjusting the brightness of the light permeable display screen 13.

In some embodiments, the light permeable display screen 13 includes an OLED display screen.

Specifically, the light permeable display screen 13 can be an OLED (Organic Light-Emitting Display) screen, the OLED screen has excellent light transmission performance, and the light sensor 15 can be disposed below the OLED screen without affecting the normal display function of the display screen, the light can also be received by the light sensor 15 through the OLED screen. It could be understood that the light permeable display screen 13 can also adopt a micro LED screen, and the micro LED screen also has good light transmittance. Certainly, these display screens are merely exemplary, and embodiments of the present disclosure are not limited thereto.

Referring to FIG. 3 and FIG. 4 again, in some embodiments, the electronic device 100 further includes a light permeable touch panel 12, the light permeable cover plate 11 is formed on the light permeable touch panel 12, and the light permeable touch panel 12 is disposed to the light permeable display screen 13. The upper surface 131 of the light permeable display screen 13 faces the light permeable touch panel 12, and the light permeable touch panel 12 has a visible light transmittance of greater than 90%.

Specifically, the light permeable touch panel 12 is mainly configured to receive an input signal generated when the user touches the light permeable touch panel 12 and transmit the input signal to the processor for data processing, thereby obtaining a specific position where the user touches the light permeable touch panel 12. The light permeable touch panel 12 can be attached to the light permeable display screen 13 by using In-Cell or On-Cell bonding technology, which can effectively reduce a weight of the display screen and reduce the overall thickness of the display screen. In addition, the light permeable cover plate 11 is disposed on the light permeable touch panel 12, which can effectively protect the light permeable touch panel 12 and its internal structures, avoiding external forces from damaging the light permeable touch panel 12 and the light permeable display screen 13. In addition, the light permeable cover plate 11 and the light permeable touch panel 12 have a visible light transmittance of greater than 90%, which is not only beneficial for the light permeable display screen 13 to display content and effect better, but also for the light sensor 15 disposed below the light permeable display screen 13 to receive the visible light stably, thus ensuring a normal operation of the light sensor 15.

In some embodiments, the upper surface 131 of the light permeable display screen 13 includes a display area 1311, and a ratio of an area of the display area 1311 to an area of the light permeable cover plate 11 is greater than 90%.

Specifically, by setting an area ratio of the display area 1311 and the light permeable cover plate 11, when the light permeable cover plate 11 is attached to the light permeable display screen 13, the display area 1311 can display the content and effect with a greater size and area, which not only enhances the good user experience, but also increases a screen ratio of the electronic device 100 effectively and hence achieves a full screen effect.

In some embodiments, the light sensor 15 includes an ambient light sensor 15, and the ambient light sensor 15 is configured to sense ambient light so as to adjust the brightness of the light permeable display screen 13.

Specifically, when the user uses the electronic device in different environments, the ambient light is received by the ambient light sensor 15 through the curved surface portion 112 of the light permeable cover plate 11, and intensity of the external light is calculated by data calculation of the processor so that the brightness of the light permeable display screen 13 can be automatically adjusted, which may not only improve the using comfort in different environments, but also save power.

Referring to FIG. 4 and FIG. 6, in some embodiments, the electronic device 100 further includes a buffer layer 16, and the buffer layer 16 covers the lower surface 132.

Specifically, the buffer layer 16 is configured to mitigate impact and shock to protect the light permeable touch panel 12 and the light permeable display screen 13 and their internal structures, preventing the light permeable display screen 13 from being damaged due to being subject to external shocks. The buffer layer 16 may be made of foam or foam plastic or rubber or other soft material. It could be understood that these cushioning materials are merely exemplary, and embodiments of the present disclosure are not limited thereto.

Referring to FIG. 4 and FIG. 6, in some embodiments, the electronic device 100 further includes a metal sheet 17 covering the buffer layer 16.

Specifically, the metal sheet 17 is configured to shield electromagnetic interference and connect ground and has a function of diffusing temperature rise. The metal sheet 17 can be formed by cutting a metal material such as copper foil or aluminum foil. It is understood that these metal materials are merely exemplary and embodiments of the present disclosure are not limited thereto.

Figure 7:
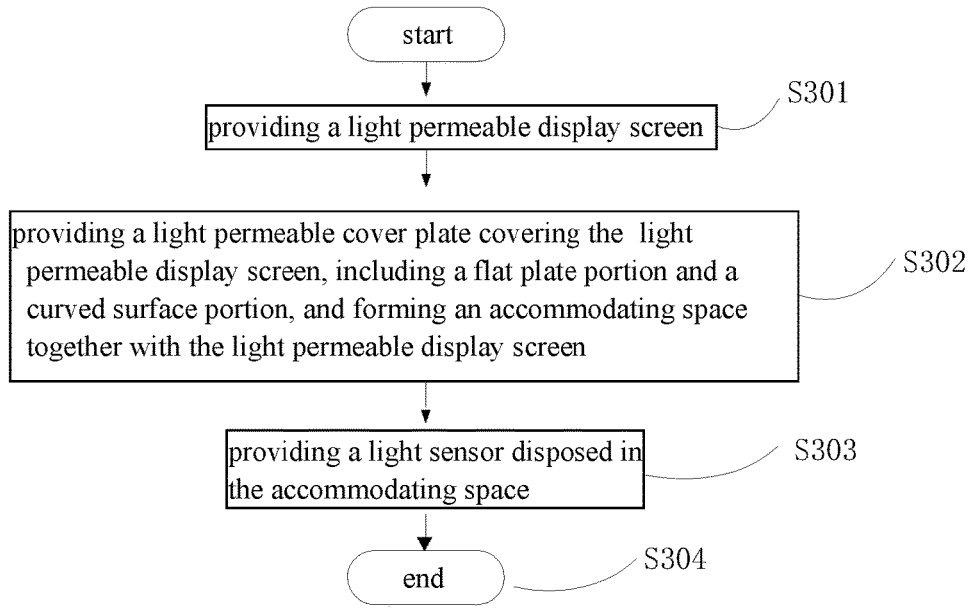
FIG. 7 is a flow chart of a manufacturing method for an electronic device according to an embodiment of the present disclosure.

The embodiments of the present disclosure provide a manufacturing method for the electronic device 100, including operations at blocks illustrated in FIG. 7.

S301: providing a light permeable display screen 13, the light permeable display screen 13 having an upper surface 131 and a lower surface 132 opposite to the upper surface 131, the light permeable display screen 13 being used for luminescence display through the upper surface 131.

S302: covering the light permeable display screen 13 with a light permeable cover plate 11, the light permeable cover plate 11 including a flat plate portion 111 and a curved surface portion 112, the curved surface portion 112 being formed to extend away from the flat plate portion 111, the curved surface portion 112 protruding from the light permeable display screen 13 horizontally so as to form an accommodating space 14.

S303: providing a light sensor 15, arranging the light sensor 15 in the accommodating space, the light sensor 15 being configured to receive visible light through the curved surface portion 112.

Specifically, the light permeable display screen 13 is covered with the light permeable cover plate 11, and a transverse size of the light permeable cover plate 11 is greater than that of the light permeable display screen 13. A protruding part of the curved surface portion 112 of the light permeable cover plate 11 and the light permeable display screen 13 constitute the accommodating space 14, the light sensor 15 can be disposed in the accommodating space 14 in the case of the full screen, and the light sensor 15 receives the visible light through the curved surface portion 112. Thus, it is guaranteed that the light sensor 15 can realize its function stably without interfering with other elements.

The light permeable display screen 13 can be an OLED (Organic Light-Emitting Display) screen, and the OLED screen has excellent light transmission performance and is permeable to visible light. Thus, the OLED screen doesn't influence a visible light reception of the light sensor 15 while displaying the content and effect. The light permeable display screen 13 can also adopt a micro LED screen, and the micro LED screen also has good light transmittance for visible light. Certainly, these display screens are merely exemplary, and embodiments of the present disclosure are not limited thereto.

Figure 8:
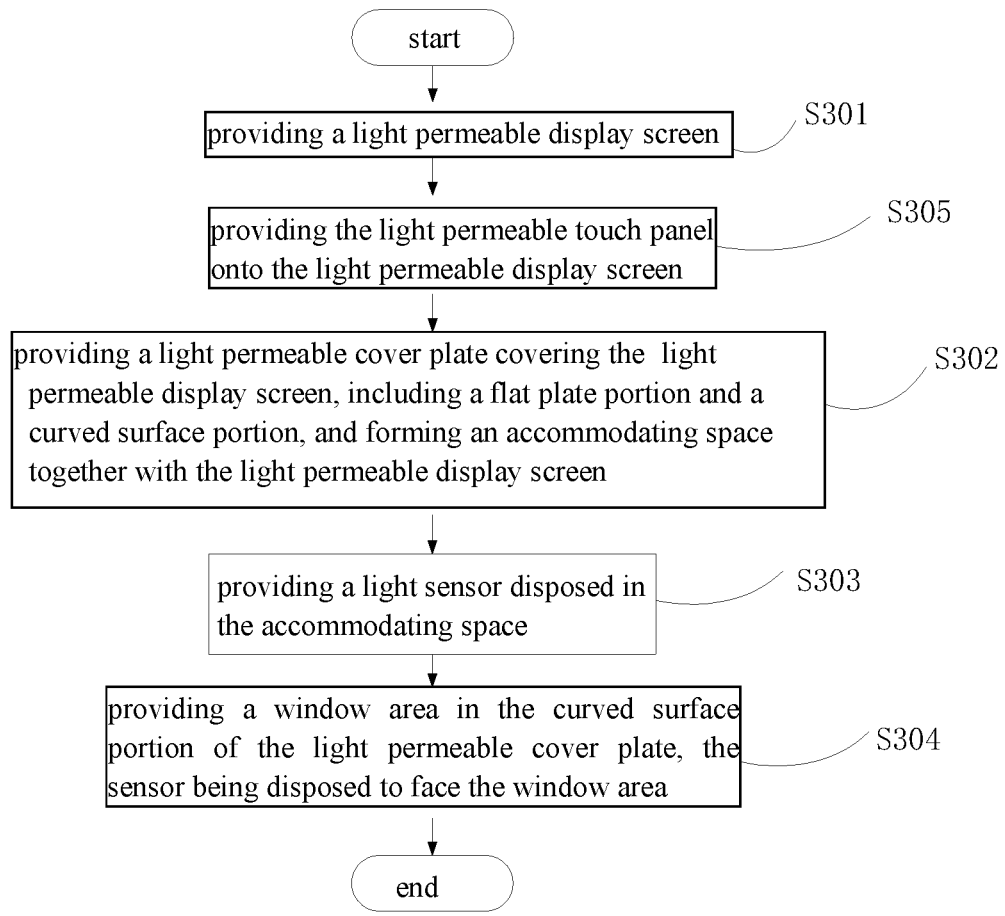
FIG. 8 is a flow chart of a manufacturing method for an electronic device according to some embodiments of the present disclosure.

In some embodiments, the manufacturing method for the electronic device 100 further includes the following operation at a block illustrated in FIG. 8.

S304: providing a window area 1123 in the curved surface portion 112, the light sensor 15 being arranged to face the window area 1123.

In some embodiments, the manufacturing method for the electronic device 100 further includes the following operation at a block illustrated in FIG. 8.

S305: providing the light permeable touch panel 12 onto the light permeable display screen 13.

Specifically, the light permeable touch panel 12 is configured to receive an input signal generated when the user touches the light permeable touch panel 12 and transmit the input signal to the circuit board for data processing, thereby obtaining a specific location where the user touches the light permeable touch panel 12. The light permeable touch panel 12 can be attached to the light permeable display screen 13 by using In-Cell or On-Cell bonding technology, which can effectively reduce the weight of the display screen and reduce the overall thickness of the electronic device 100.

Figure 9:
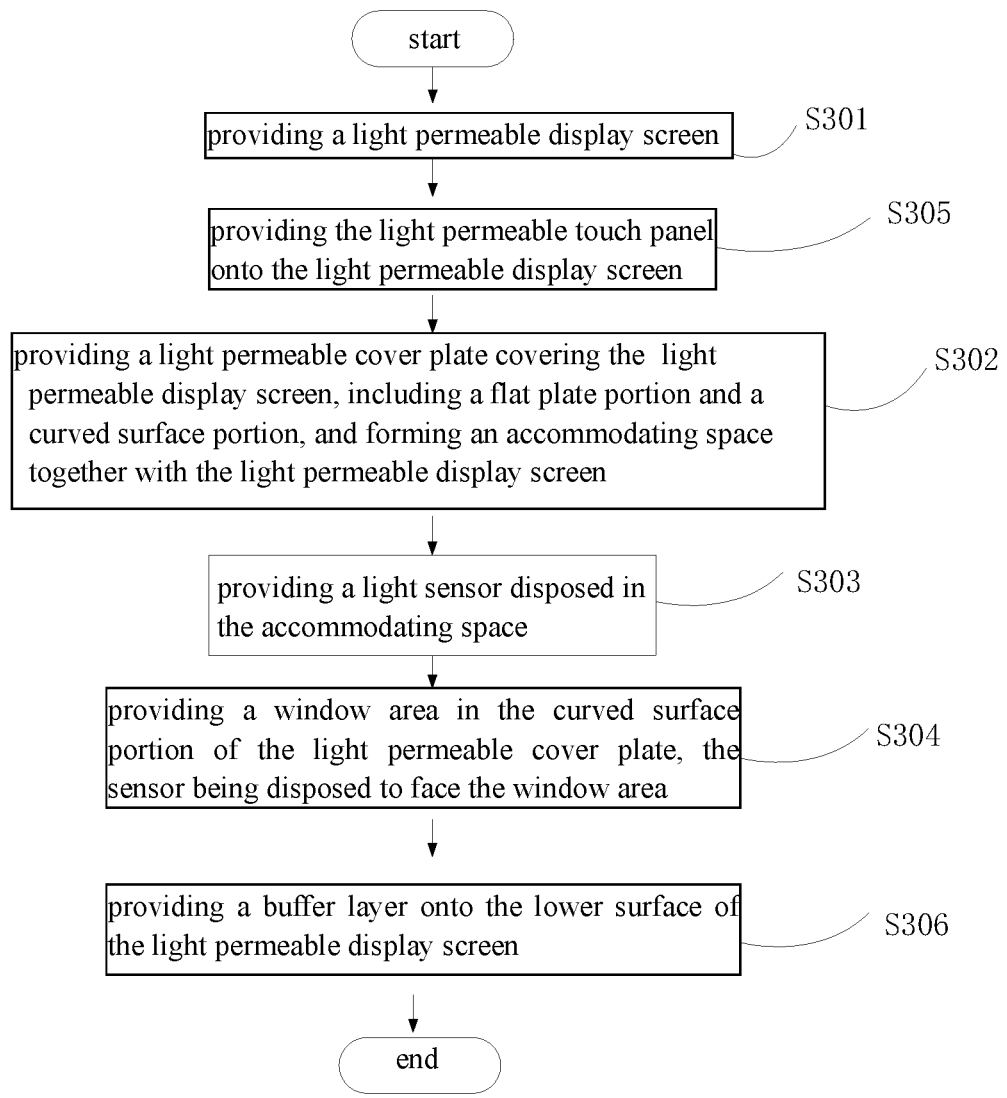
FIG. 9 is a flow chart of a manufacturing method for an electronic device according to some embodiments of the present disclosure.

In some embodiments, manufacturing method for the electronic device 100 further includes an operation at a block illustrated in FIG. 9.

S306: providing a buffer layer 16 onto the lower surface 132, the buffer layer 16 covering the lower surface 132.

Specifically, the buffer layer 16 is configured to mitigate impact and shock to protect the light permeable touch panel 12 and the light permeable display screen 13 and their internal structures, preventing the electronic device 100 from being damaged due to being subject to external shocks. The buffer layer 16 may be made of foam or foam plastic or rubber or other soft material. It could be understood that these cushioning materials are merely exemplary, and embodiments of the present disclosure are not limited thereto.

Figure 10:
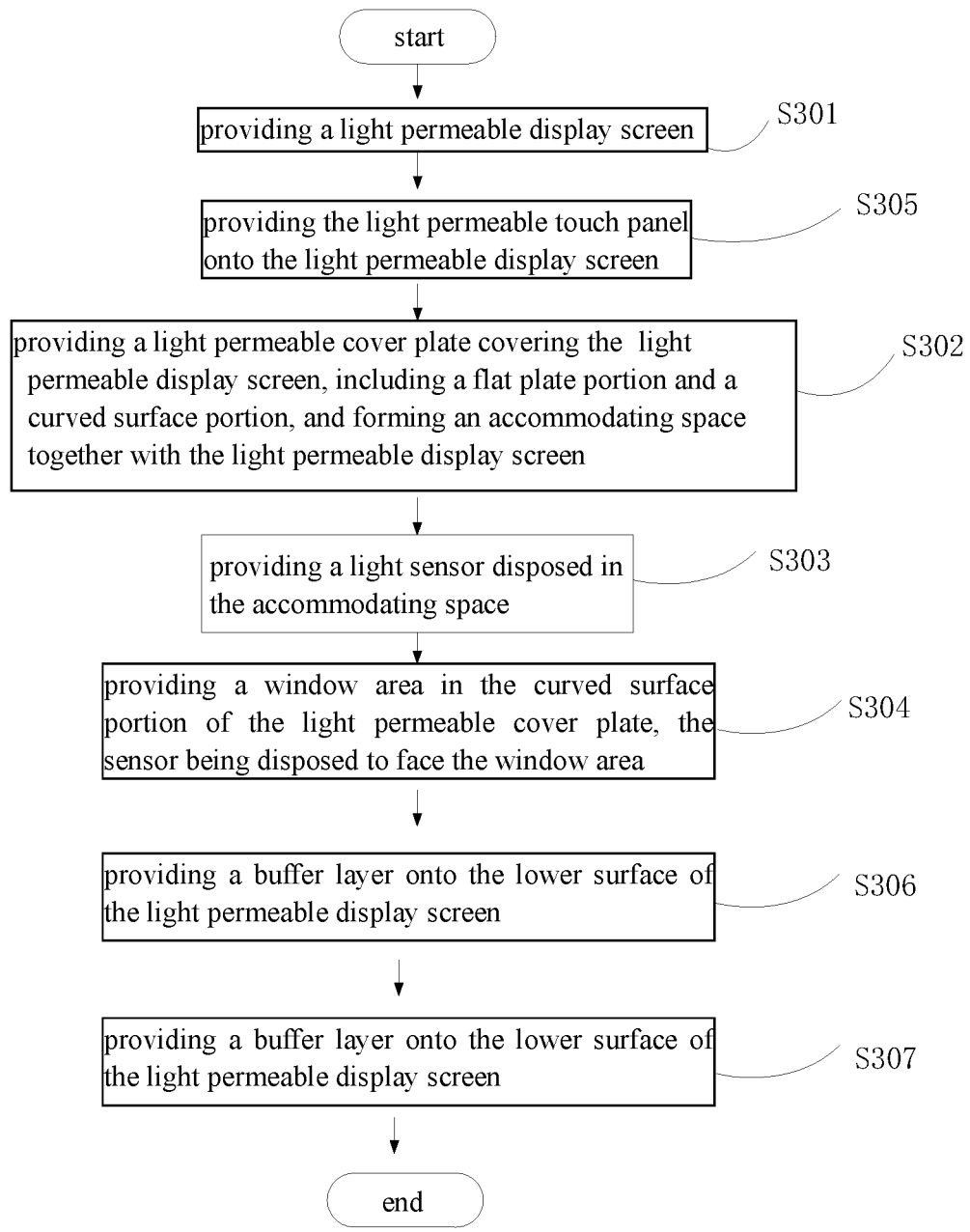
FIG. 10 is a flow chart of a manufacturing method for an electronic device according to embodiments of the present disclosure.

In some embodiments, the manufacturing method for the electronic device 100 further includes the following operation at a block illustrated in FIG. 10.

S307: providing a metal sheet 17 below the buffer layer 16, the metal sheet 17 covering the buffer layer 16.

Specifically, the metal sheet 17 is configured to shield electromagnetic interference and connect ground and has a function of diffusing temperature rise. The metal sheet 17 can be formed by cutting a metal material such as copper foil or aluminum foil. It is understood that these metal materials are merely exemplary and embodiments of the present disclosure are not limited thereto.

In some embodiments, the curved surface portion 112 includes a first curved surface portion 1121 and a second curved surface portion 1122, the first curved surface portion 1121 and the second curved surface portion 1122 are symmetrically disposed. Each of the curved surface portions 112 forms the accommodating space 14 together with the light permeable display screen 13. The light sensor 15 includes a first light sensor 151 and a second light sensor 152, and the first light sensor 151 and the second light sensor 152 are respectively disposed in the accommodating space. In this way, by providing the light sensor 15 in each of the accommodating spaces 14 at left and right sides of the light permeable cover plate 11, an angle and data of the visible light received by the two light sensors 15 are mutually compensated, thereby ensuring the accuracy of the light adjustment, hence ensuring better user experience.

Specifically, during the installation process, the light sensor 15 is arranged to face the window area 1123 and the first light sensor 151 and the second light sensor 152 are respectively disposed in the accommodating spaces 14 formed by the first curved surface portion 1121 and the light permeable display screen 13, and by the second curved surface portion 1122 and the light permeable display screen 13. Since the light permeable cover plate 11 includes the curved surface portion 112 and the light sensor 15 receives the visible light through the curved surface portion 112, if only one light sensor 15 is used, when the electronic device is used by the user in the same environment, a tilt of the light permeable display screen 13 can result a change of a visible light receiving angle of the light sensor 15, causing the brightness of the light permeable display screen 13 to change significantly, thereby affecting the user experience. Therefore, the first light sensor 151 and the second light sensor 152 are respectively disposed in the accommodating spaces 14 at the left and right sides of the light permeable display screen 13, and the visible light receiving angles of the two light sensors are mutually compensated, so that the accuracy of the light adjustment can be ensured. Moreover, in some examples, when the light permeable display screen 13 is placed flat, the two light sensors 15 receive the visible light at the same angle, and the processor can take 50% of the data of each of the light sensors 15 as a value for adjusting the brightness. In other examples, when the light permeable display screen 13 is tilted to the side of the first light sensor 151, the visible light receiving angle of the first light sensor 151 becomes smaller, and the visible light receiving angle of the second light sensor 152 becomes larger, thus causing received data by the two light sensors to be inconsistent, in which case the processor can use an average value of the two data as the value for the brightness adjustment so as to accurately adjust the brightness of the light permeable display screen 13 to ensure better user experience. Moreover, in some examples, the first light sensor 151 and the second light sensor 152 can be disposed in the formed accommodating spaces 14 symmetrically. In other examples, the first light sensor 151 and the second light sensor 152 can also be disposed in the formed accommodating spaces asymmetrically. Thus, by providing the light sensor 15 at each accommodating space 14 at left and right sides of the light permeable cover plate 11, the receiving angle and data of the two light sensors 15 compensate each other, which can improve the accuracy of the operation of the light sensor 15 so as to ensure better user experience.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below,"

"under," or "on bottom of" the second feature, or just means that the first feature is at a height lower than that of the second feature.

Various embodiments and examples are provided in the description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Reference throughout this specification to "an embodiment," "some embodiments," "an illustrative embodiment," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although embodiments have been illustrated and described, it would be appreciated by those skilled in the art that changes, modifications, alternatives and variants can be made in the embodiments without departing from principles and purposes of the present disclosure. The protection scope of the present disclosure is defined by the claims or the like.

What is claimed is:

1. An electronic device, comprising:
a light permeable display screen comprising a flat display portion and a curved display portion extending away from the flat display portion;
a light permeable cover plate covering the light permeable display screen, a transverse size of the light permeable cover plate being greater than a transverse size of the light permeable display screen, the light permeable cover plate comprising a flat plate portion and a plurality of curved surface portions, the plurality of curved surface portions extending away from the flat plate portion, protruding from the light permeable display screen horizontally, and bending towards the light permeable display screen vertically, so as to form a plurality of accommodating spaces together with the light permeable display screen, the curved display portion bending in a direction consistent with a bending direction of the plurality of curved surface portions; and
a plurality of light sensors arranged in the plurality of accommodating spaces,
wherein the plurality of curved surface portions comprises a first curved surface portion and a second curved surface portion, the first curved surface portion and the second curved surface portion are symmetrically disposed at left and right sides of the light permeable cover plate, the plurality of the accommodating spaces comprises a first accommodating space and a second accommodating space, the plurality of light sensors comprises a first light sensor and a second light sensor, the first accommodating space is formed by the first curved surface portion and the light permeable display screen, the second accommodating space is formed by the second curved surface portion and the light permeable display screen, and the first light sensor is located in the first accommodating space and the second light sensor is located in the second accommodating space.

2. The electronic device according to claim 1, wherein the first light sensor is located in the first accommodating space at a first angle of inclination relative to a plane where the flat plate portion is located, and the second light sensor is located in the second accommodating space at a second angle of inclination relative to the plane where the flat plate portion is located.

3. The electronic device according to claim 1, wherein the first light sensor is positioned horizontally in the first accommodating space and the second light sensor is positioned horizontally in the second accommodating space.

4. An electronic device, comprising:
a light permeable display screen, the light permeable display screen comprising a first surface and a second surface opposite to the first surface;
a light permeable cover plate facing the first surface of the light permeable display screen and covering the light permeable display screen, the light permeable cover plate comprising a flat plate portion and a plurality of curved surface portions, the plurality of curved surface portions extending away from the flat plate portion, protruding from the light permeable display screen horizontally, and bending towards the light permeable display screen vertically, so as to form a plurality of accommodating spaces together with the light permeable display screen; and
a plurality of light sensors arranged in the plurality of accommodating spaces, the plurality of light sensors being configured to receive visible light through the plurality of curved surface portions,
wherein the plurality of curved surface portions comprises a first curved surface portion and a second curved surface portion symmetrically disposed at left and right sides of the light permeable cover plate, the plurality of the accommodating spaces comprises a first accommodating space and a second accommodating space, the first accommodating space is formed by the first curved surface portion and the light permeable display screen, the second accommodating space is formed by the second curved surface portion and the light permeable display screen, the plurality of the light sensors comprises a first light sensor and a second light sensor, the first light sensor is located in the first accommodating space and the second light sensor is located in the second accommodating space.

5. The electronic device according to claim 4, wherein each of the plurality of curved surface portions comprises a window area, and each of the plurality of light sensors faces the window area.

6. The electronic device according to claim 4, wherein the light permeable display screen is a flat display screen.

7. The electronic device according to claim 4, wherein the light permeable display screen comprises a flat display portion and a curved display portion extending away from the flat display portion, the flat display portion having a third surface and the curved display portion having a fourth surface, the third surface and the fourth surface constitute the first surface, and a transverse size of the light permeable cover plate is greater than a transverse size of the light permeable display screen.

8. The electronic device according to claim 4, wherein the light permeable display screen is an OLED screen.

9. The electronic device according to claim 4, further comprising a light permeable touch panel, the light permeable touch panel being disposed above the light permeable display screen, the first surface facing the light permeable touch panel, and the light permeable touch panel having visible light transmittance of greater than 90%.

10. The electronic device according to claim 4, wherein the first surface comprises a display area, the light permeable display screen is used for luminescence display through the display area, and a ratio of an area of the display area to an area of the light permeable cover plate is greater than 90%.

11. The electronic device according to claim 4, wherein the plurality of light sensors comprises an ambient light sensor, and the ambient light sensor is configured to sense ambient light so as to adjust brightness of the light permeable display screen.

12. The electronic device according to claim 4, further comprising a buffer layer covering the second surface.

13. The electronic device according to claim 12, further comprising a metal sheet covering the buffer layer.

14. A manufacturing method for an electronic device, comprising following operations:
    providing a light permeable display screen, the light permeable display screen comprising a
    first surface and a second surface opposite to the first surface;
    covering a first surface of the light permeable display screen with a light permeable cover plate, the light permeable cover plate comprising a flat plate portion and a plurality of curved surface portions, the plurality of curved surface portions extending away from the flat plate portion, protruding from the light permeable display screen horizontally, and bending towards the light permeable display screen vertically, so as to form a plurality of accommodating spaces together with the light permeable display screen; and
    providing a plurality of light sensors, arranging the plurality of light sensors in the plurality of accommodating spaces, the plurality of light sensors being configured to receive visible light through the plurality of curved surface portions,
wherein the plurality of curved surface portions comprises a first curved surface portion and a second curved surface portion symmetrically disposed at left and right sides of the light permeable cover plate, the plurality of the accommodating spaces comprises a first accommodating space and a second accommodating space, the first accommodating space is formed by the first curved surface portion and the light permeable display screen, the second accommodating space is formed by the second curved surface portion and the light permeable display screen, the plurality of the light sensors comprises a first light sensor and a second light sensor, the first light sensor is located in the first accommodating space and the second light sensor is located in the second accommodating space.

15. The manufacturing method for the electronic device according to claim 14, further comprising:
    providing a window area in each of the plurality of curved surface portions, each of the plurality of light sensors being arranged to face the window area.

16. The manufacturing method for the electronic device according to claim 14, further comprising:
    providing a light permeable touch panel onto the first surface.

17. The manufacturing method for the electronic device according to claim 14, further comprising:
    providing a buffer layer onto the second surface, the buffer layer covering the second surface.

18. The manufacturing method for the electronic device according to claim 17, further comprising:
    providing a metal sheet covering the buffer layer.

19. The electronic device according to claim 1, wherein visible light receiving angles of the first light sensor and the second light sensor are mutually compensated.

* * * * *